United States Patent
Noma et al.

(10) Patent No.: US 7,102,238 B2
(45) Date of Patent: Sep. 5, 2006

(54) SEMICONDUCTOR DEVICE AND MANUFACTURING METHOD THEREOF

(75) Inventors: Takashi Noma, Ota (JP); Akira Suzuki, Ota (JP); Hiroyuki Shinogi, Ora-gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/828,556

(22) Filed: Apr. 21, 2004

(65) Prior Publication Data

US 2004/0262732 A1   Dec. 30, 2004

(30) Foreign Application Priority Data

Apr. 24, 2003   (JP) ............... 2003-120228

(51) Int. Cl.
*H01L 23/48* (2006.01)
*H01L 23/52* (2006.01)
*H01L 29/40* (2006.01)

(52) U.S. Cl. ............ 257/777; 257/686; 257/723; 257/730

(58) Field of Classification Search ........... 257/686, 257/777, 723, 730
See application file for complete search history.

(56) References Cited

U.S. PATENT DOCUMENTS

| | | | |
|---|---|---|---|
| 5,648,684 A * | 7/1997 | Bertin et al. ............ 257/685 |
| 6,002,163 A | 12/1999 | Wojnarowski | |
| 6,054,760 A * | 4/2000 | Martinez-Tovar et al. .. 257/692 |
| 6,221,751 B1 | 4/2001 | Chen et al. | |
| 6,326,689 B1 * | 12/2001 | Thomas ............ 257/734 |
| 6,894,386 B1 * | 5/2005 | Poo et al. ............ 257/730 |
| 2002/0025587 A1 | 2/2002 | Wada | |
| 2002/0047210 A1 | 4/2002 | Yamada et al. | |
| 2002/0139577 A1 * | 10/2002 | Miller ............ 174/261 |

FOREIGN PATENT DOCUMENTS

JP   09-232503   9/1997

* cited by examiner

*Primary Examiner*—Nitin Parekh
(74) *Attorney, Agent, or Firm*—Morrison & Foerster LLP (57) ABSTRACT

A stacked MCM is manufactured at reduced cost without using expensive apparatus. A first wiring and a second wiring are formed on a surface of a semiconductor chip of a first semiconductor device through an insulation film. A glass substrate having an opening to expose the second wiring is bonded to the surface of the semiconductor chip on which the first wiring and the second wiring are formed. A third wiring is disposed on a back surface and a side surface of the semiconductor chip through an insulation film and connected to the first wiring. And a conductive terminal of another semiconductor device is connected to the second wiring through the opening.

9 Claims, 7 Drawing Sheets

SEMICONDUCTOR DEVICE AND MANUFACTURING METHOD THEREOF

CROSS-REFERENCE OF THE INVENTION

This invention is based on Japanese Patent Application No. 2003-120228, the content of which is incorporated by reference in its entirety.

BACKGROUND OF THE INVENTION

1. Field of the Invention

This invention relates to a semiconductor device and its manufacturing method specifically to a packaging technology of a semiconductor chip.

2. Description of the Related Art

An MCM (Multi-Chip Module) has received attention in recent years as a new packaging technology. The MCM is a high performance module implemented by incorporating a plurality of semiconductor chips into a single package. There are various kinds of MCMs depending on how the semiconductor chips are placed. Among them, attention is focused on a "stacked MCM" which is made by stacking a plurality of semiconductor chips.

Figure 14:
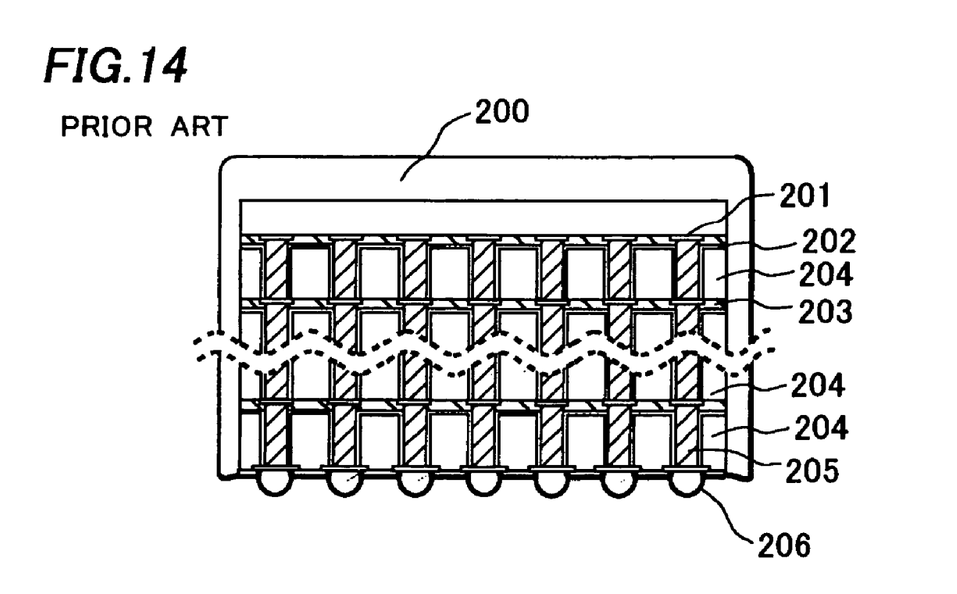
FIG. 14 is a diagrammatic drawing showing a cross-section of an MCM type semiconductor device according to a conventional art.

An example of the stacked MCM structure is shown in FIG. 14. The stacked MCM 200 is made by stacking a plurality of semiconductor chips 204. Via holes 205 cutting through the semiconductor chips 204 are formed by laser processing. Barrier metals 202 are formed on side surfaces of the via holes by sputtering or by CVD (Chemical Vapor Deposition). Vertically adjacent semiconductor chips 204 are connected with each other through wirings formed by burying conductive material in the via holes 205 by copper plating.

Insulation between the semiconductor chips 204 is maintained by inserting a thermoplastic film 203. The plurality of semiconductor chips 204 are stacked by repeating such manufacturing process steps. Connections to an external circuit are made through conductive terminals 206 attached to a semiconductor chip 204 disposed at the bottom of the stack.

The stacked MCM 200 is manufactured by the manufacturing steps described above. The stacked MCM mentioned above is disclosed, for example, in Japanese Patent Application Publication No. 9-232503.

Manufacturing the stacked MCM 200 described above requires forming via holes which are tens of micrometers in diameter and in depth and burying the conductive material in the via holes. Consequently the manufacturing process requires expensive apparatus not used in conventional packaging of semiconductors such as a laser processing machine to process the via holes, barrier CVD equipment to form the barrier metal films and copper plating equipment to bury in the via holes, causing a problem of higher manufacturing cost.

SUMMARY OF THE INVENTION

A first wiring and a second wiring are formed on a surface of a semiconductor chip through a first insulation film in a semiconductor device of this invention. A supporting body having an opening to expose the second wiring is bonded to the surface of the semiconductor chip on which the first and the second wirings are formed. A third wiring is formed on a back surface and a side surface of the semiconductor chip through a second insulation film and is connected to the first wiring.

DETAILED DESCRIPTION OF THE INVENTION

Next, a semiconductor device and its manufacturing method according to an embodiment of this invention will be described, referring to FIGS. 1 through 13.

Figure 1:
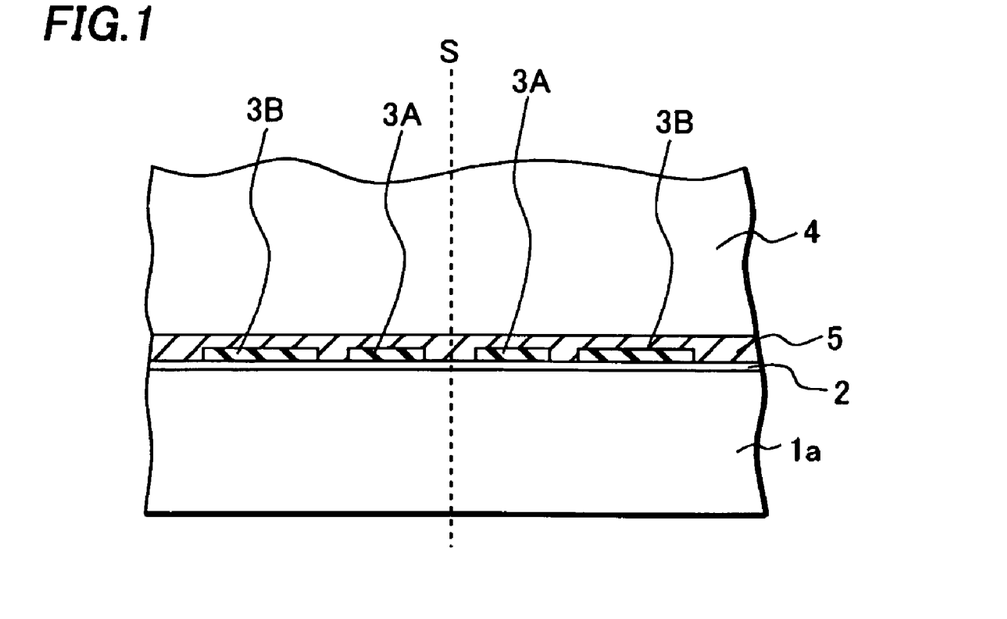
FIG. 1 is a cross-sectional view showing a manufacturing method of a semiconductor device according to an embodiment of this invention.

First, a semiconductor wafer 1a is provided, as shown in FIG. 1. The semiconductor wafer 1a will be cut into a plurality of semiconductor chips 1 in a process step which will be described later. The semiconductor chips 1 are CCD (Charge Coupled Device) image sensors or semiconductor memory chips, for example, and are manufactured by semiconductor wafer processing. A plurality of first wirings 3A and a plurality of second wirings 3B are formed on a surface of the semiconductor wafer 1a through an insulation film 2 simultaneously. The first wirings 3A are formed to have a predetermined length of separation from each other across a border S along which the semiconductor wafer 1a is to be cut into the plurality of semiconductor chips 1. The border S is called a dicing line or a scribe line.

The first wiring 3A is to place a pad at a location away from an ordinary bonding pad area on the semiconductor chip 1 and closer to the border S. The plurality of second wirings 3B connect conductive pads electrically to conductive terminals of another semiconductor device stacked on the semiconductor chip 1 in a later process step.

Then a glass substrate 4 making a supporting body is bonded to the surface of the semiconductor wafer 1a, on which the first wirings 3A and the second wirings 3B are formed, using an epoxy resin layer 5 as an adhesive. Note that a silicon substrate, a plastic plate or a tape- or sheet-shaped material may be used as the supporting body other than the glass substrate used in the embodiment. An adhesive suitable for the chosen supporting body is to be selected in this case.

Figure 2:
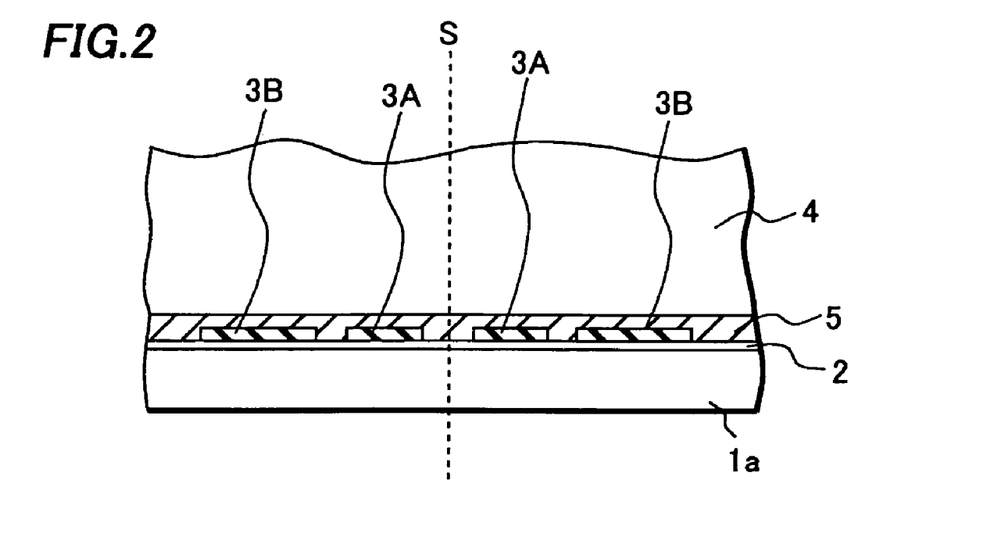
FIG. 2 is a cross-sectional view showing the manufacturing method of the semiconductor device according to the embodiment of this invention.

Next, a surface of the semiconductor wafer 1a to which the glass substrate 4 is not bonded, i.e., a back surface of the semiconductor wafer 1a, is back-ground to reduce a thickness of the semiconductor wafer 1a, as shown in FIG. 2. Scratches arise on the back-ground back surface of the semiconductor wafer 1a, causing bumps and dips of several micrometers in width and in depth. Wet etching is conducted to reduce them using a silicon etching solution which has higher selection rate on silicon which is a material for the silicon wafer 1a than that on silicon dioxide (SiO2) which is a material for the insulation film 2. A mixed solution composed of 2.5% of hydrofluoric acid, 50% of nitric acid, 10% of acetic acid and 37.5% of water is suitable as the silicon etching solution, for example.

Figure 3:
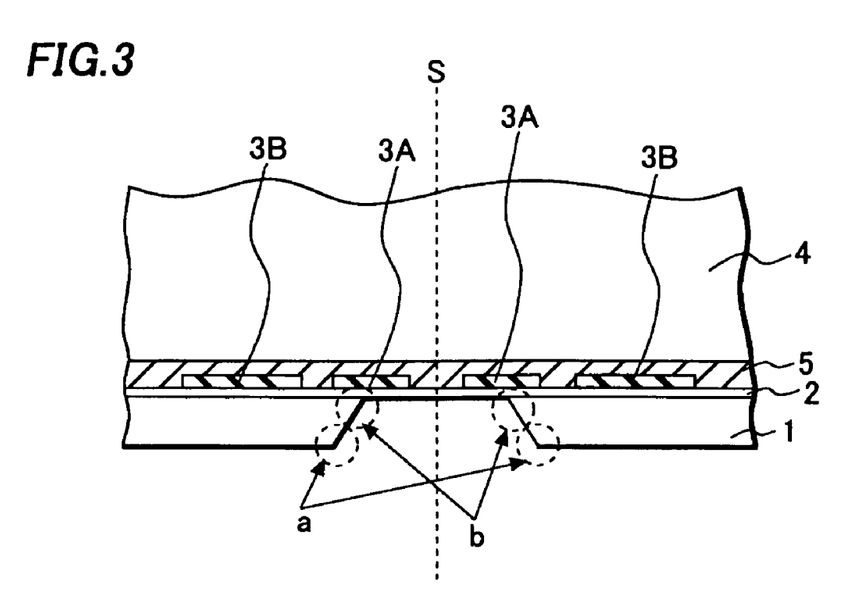
FIG. 3 is a cross-sectional view showing the manufacturing method of the semiconductor device according to the embodiment of this invention.

Next, isotropic etching is made on the back surface of the semiconductor wafer 1a using a mask of photoresist (not shown) provided with an opening along the border S, as shown in FIG. 3. A groove is formed in the silicon wafer 1a along the border S to expose the insulation film 2 partially. Note that the isotropic etching may be performed either by dry-etching or by wet-etching. Although the silicon wafer 1a is cut into the plurality of semiconductor chips 1 by the etching, it is supported with the glass substrate 4 to maintain a shape of the semiconductor wafer 1a.

Figure 4:
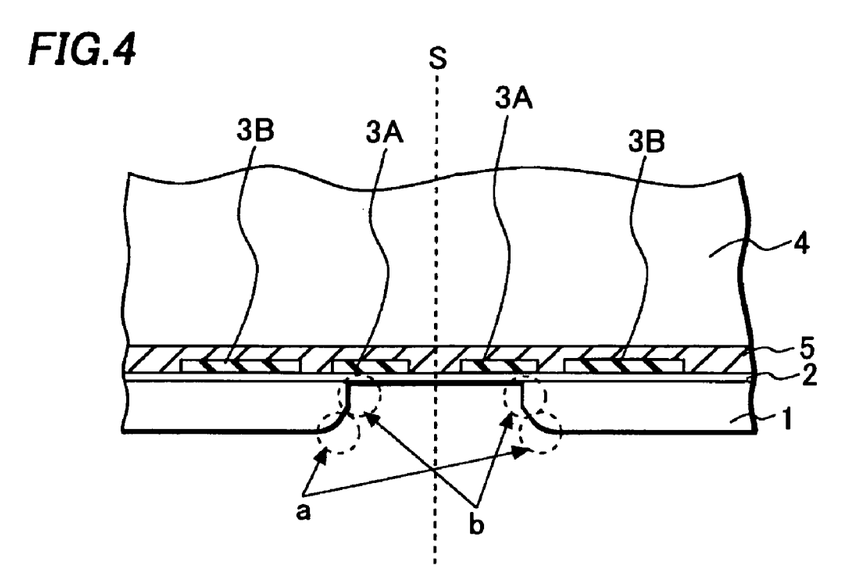
FIG. 4 is a cross-sectional view showing the manufacturing method of the semiconductor device according to the embodiment of this invention.

Bumps and dips, residues and foreign particles are left on the etched back surface of the semiconductor wafer 1a. Also corners are formed as shown in circles a and b depicted with dashed lines in FIG. 3. Wet-etching is conducted to remove the residues and the foreign particles and to round the corners, as shown in FIG. 4. The corners shown in the dashed line circles a and b in FIG. 3 are turned into smooth shapes as shown in dashed line circles a and b in FIG. 4.

Figure 5:
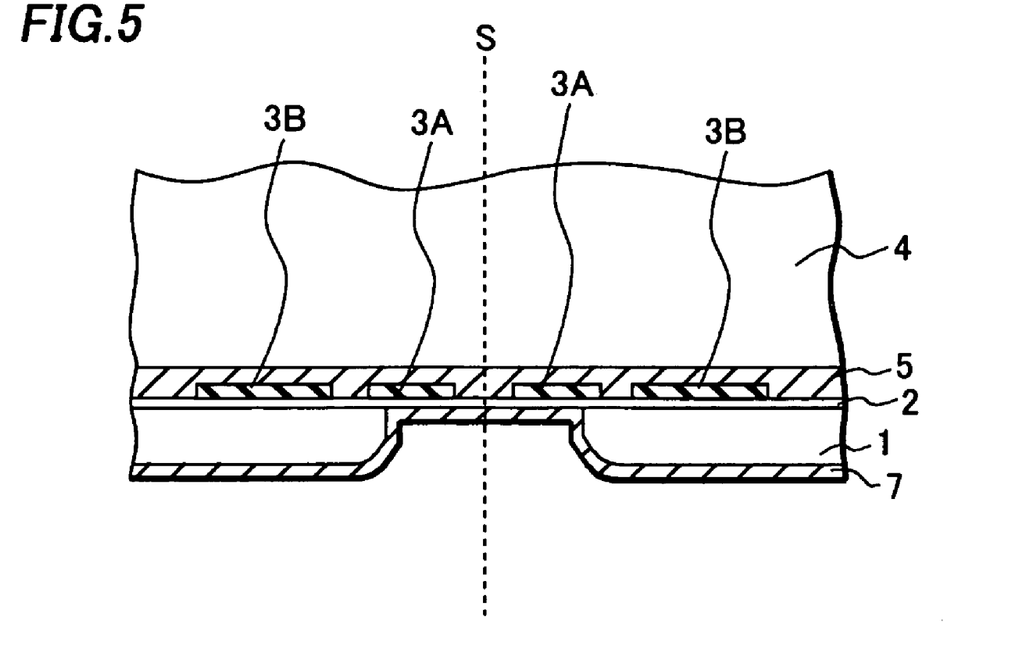
FIG. 5 is a cross-sectional view showing the manufacturing method of the semiconductor device according to the embodiment of this invention.

Next, an insulation film 7 is formed to cover the back surface and the etched side surface of the plurality of semiconductor chips 1, as shown in FIG. 5. The insulation film 7 is a silane-based oxide film, for example.

Next, a photoresist film (not shown) is applied to the back surface of the semiconductor chip 1 and patterning is made on the photoresist film. The insulation film 7 and the insulation film 2 are etched using the photoresist film as a mask to expose end portions of the first wirings 3A.

Figure 6:
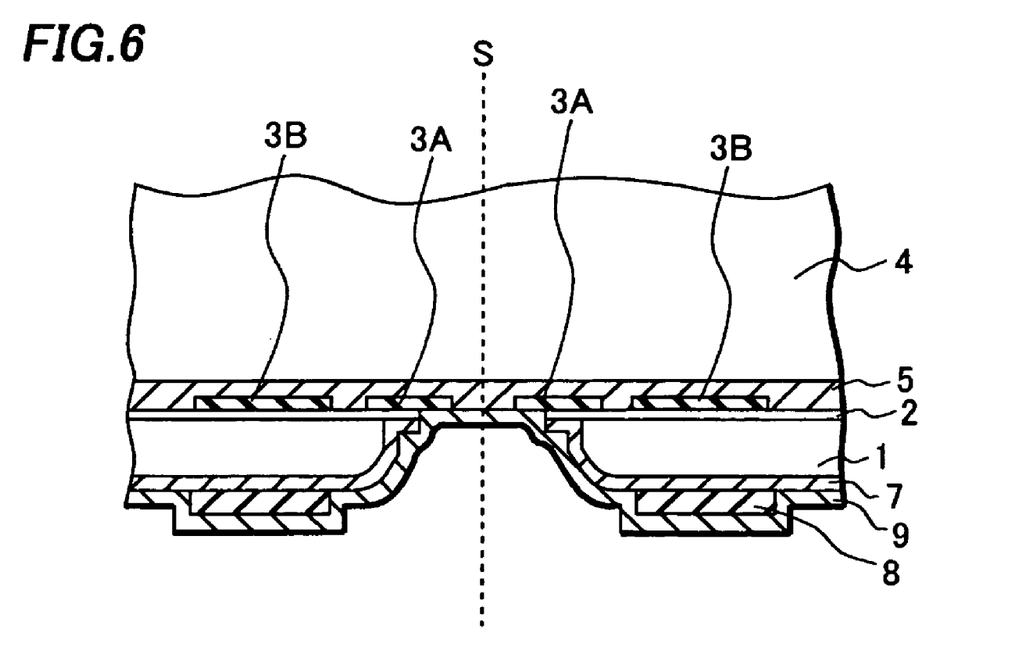
FIG. 6 is a cross-sectional view showing the manufacturing method of the semiconductor device according to the embodiment of this invention.

Next, flexible cushioning pads 8 are formed at locations where the conductive terminals 11 are to be formed. The cushioning pads 8 have function to absorb power applied through the conductive terminals 11 and relax stresses when the conductive terminals 11 are bonded. However this invention does not necessarily require the cushioning pads 8. Then the third wiring 9 is formed to cover the insulation film 7, the cushioning pads 8 and the exposed portions of the first wirings 3A, as shown in FIG. 6. With this, the first wirings 3A are electrically connected with the third wiring 9.

Figure 7:
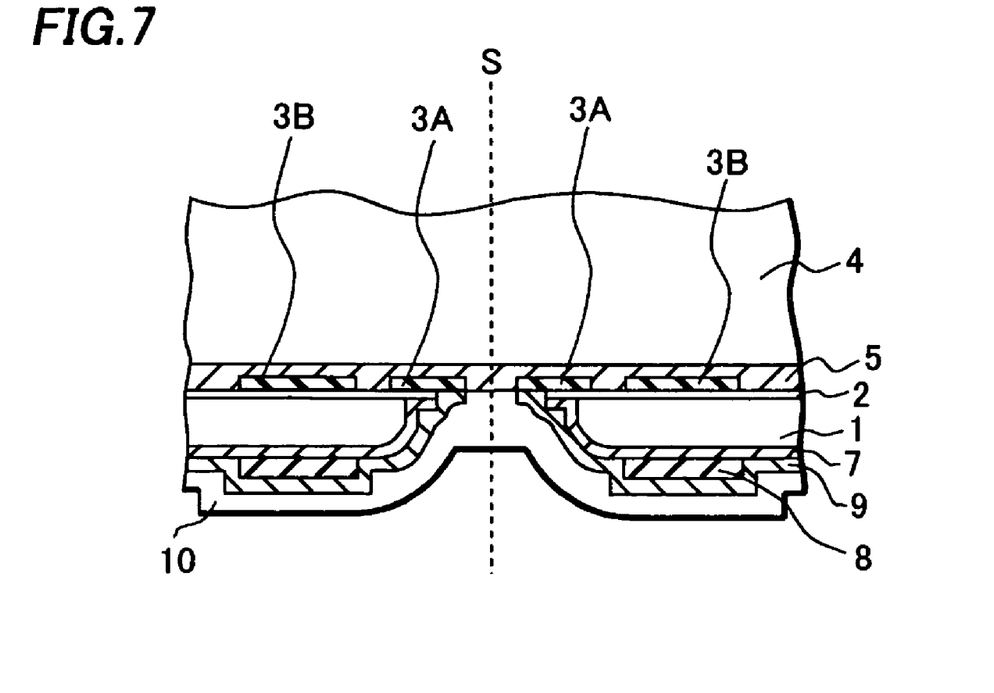
FIG. 7 is a cross-sectional view showing the manufacturing method of the semiconductor device according to the embodiment of this invention.

Next, a photoresist film (not shown) is applied to the back surface of the semiconductor chip 1 and pattering is made to form an opening in the photoresist film along the border S. Etching is done using the photoresist film as a mask to remove a portion of the third wiring 9 around the border S, as shown in FIG. 7. Although not shown in the figure, Ni—Au plating may be applied to a surface of the third wiring 9 by making electroless plating after forming the third wiring 9.

Next, a protection film 10 is formed over the back surface of the semiconductor chip 1. A thermosetting organic resin is dropped on the back surface of the semiconductor chip 1 while the back surface is facing upward, and the semiconductor wafer 1a having the plurality of semiconductor chips 1 and bonded to the glass substrate 4 is spun to form the protection film 10. The organic resin is spread over the surface of the semiconductor wafer 1a by centrifugal force caused by the spinning. The protection film 10 is formed on the surface of the third wiring 9.

Figure 8:
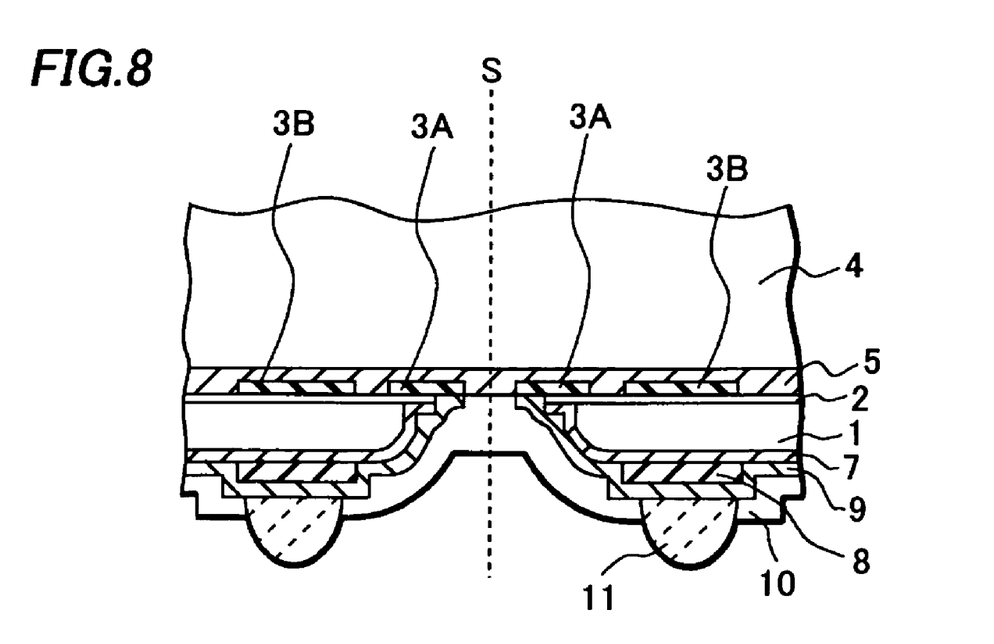
FIG. 8 is a cross-sectional view showing the manufacturing method of the semiconductor device according to the embodiment of this invention.

Next, the protection film 10 is removed from regions where the conductive terminals 11 are to be formed by selective etching using a photoresist film as a mask to expose the third wiring 9. The conductive terminals 11 are formed on the exposed third wiring 9 to make contact with it, as shown in FIG. 8. The conductive terminals 11 can be made of projecting electrode terminals such as solder bumps or gold bumps, for example. Thickness of the conductive terminals 11 is 160 µm for solder bumps and can be reduced to several micrometers—tens of micrometers when gold bumps are used. A plurality of conductive terminals 11 can be formed in similar structure on the back surface of the semiconductor chip 1 to constitute a BGA (Ball Grid Array).

Figure 9:
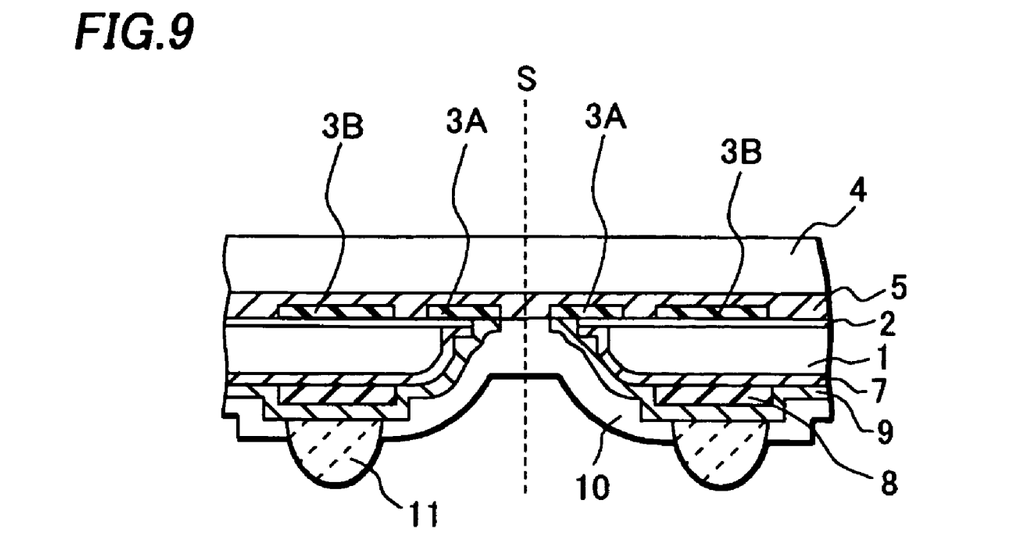
FIG. 9 is a cross-sectional view showing the manufacturing method of the semiconductor device according to the embodiment of this invention.

Next, the glass substrate 4 is thinned by removing its surface portion, as shown in FIG. 9. By doing so, processing time to form openings in the glass substrate 4, which will be described later, is shortened. Thickness of 50–100 µm is appropriate for the glass substrate 4. Followings are methods to reduce the thickness of the glass substrate 4: (1) grinding the glass substrate 4 with a back-grinding machine; (2) polishing the glass substrate 4 with CMP (Chemical Mechanical Polishing) equipment; (3) etching the glass substrate 4 by dropping etching solution onto the glass substrate 4 and rotating the semiconductor wafer 1a to which the glass substrate 4 is attached so that the etching solution pervades whole surface of the glass substrate 4, as in photoresist coating; and (4) etching the glass substrate 4 by dry etching. Note that this invention does not necessarily include the process step to reduce the thickness of the glass substrate 4 and that using a supporting body made of plate material shaped in a tape or a sheet having a predetermined thickness from the beginning is not excluded.

Figure 10:
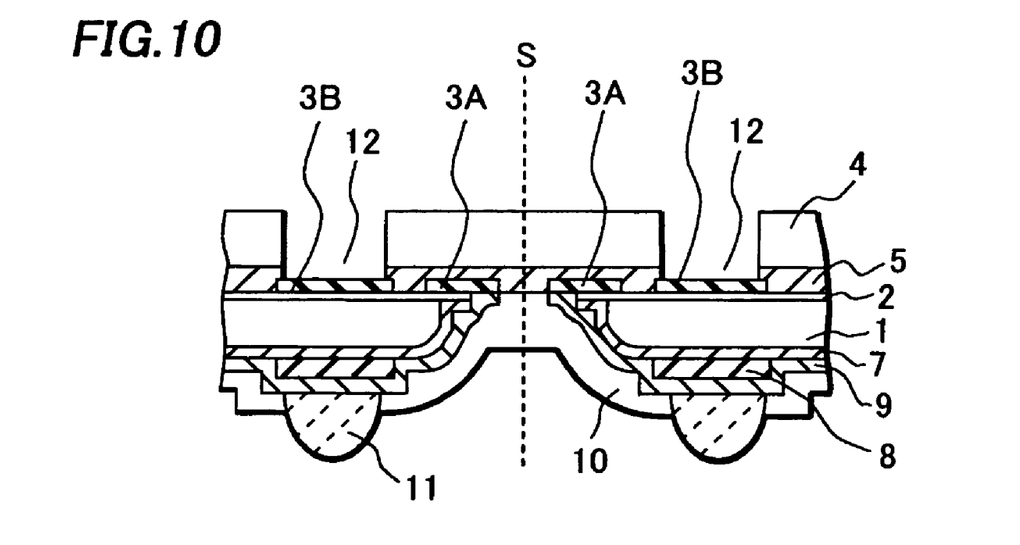
FIG. 10 is a cross-sectional view showing the manufacturing method of the semiconductor device according to the embodiment of this invention.
Figure 11:
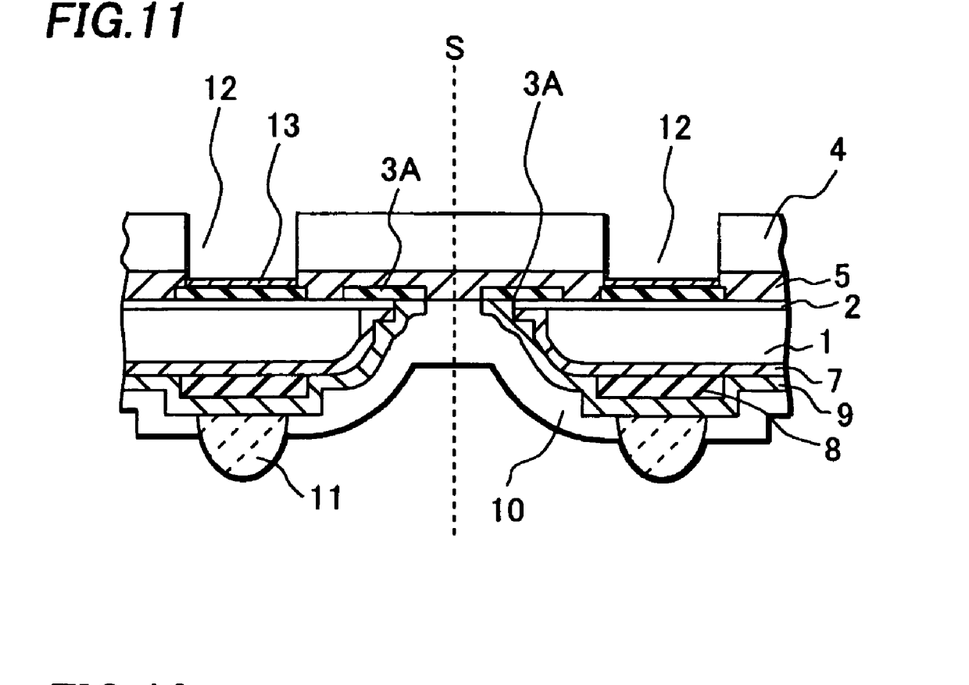
FIG. 11 is a cross-sectional view showing the manufacturing method of the semiconductor device according to the embodiment of this invention.

Next, openings 12 to expose surfaces of the second wirings 3B are formed by removing the glass substrate 4 and the resin layer 5 from regions above the second wirings 3B by etching, for example, as shown in FIG. 10. The glass substrate 4 may be thinned after forming the openings 12. However, processing time to form the openings 12 becomes longer in this case. Next, a plating layer 13 is formed on each surface of the second wirings 3B exposed in the openings 12. The plating layer 13 makes a part of the second wiring 3B. The plating layer 13 is formed by stacking a Ni plating layer and a Au plating layer, for example.

Figure 12:
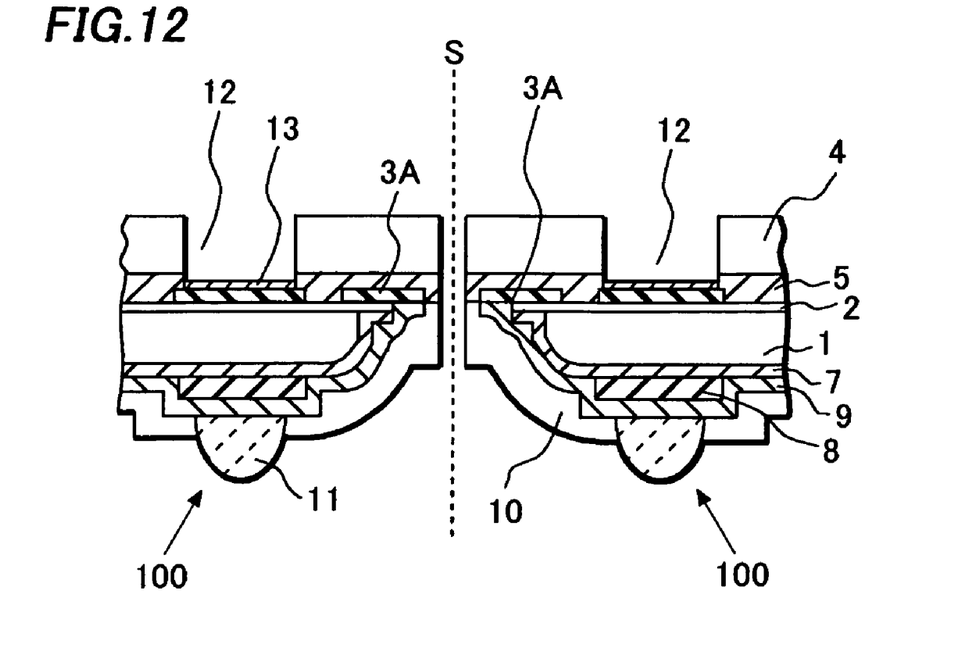
FIG. 12 is a cross-sectional view showing the manufacturing method of the semiconductor device according to the embodiment of this invention.

Next, the semiconductor wafer 1a is cut along the border S and separated into the plurality of semiconductor chips I using a dicing machine, as shown in FIG. 12. The glass substrate 4, the resin layer 5 and the protection film 10 are cut along the border S in the process. A BGA type semiconductor device 100 having the semiconductor chip 1 is hereby completed. According to the BGA type semiconductor device 100, only one glass substrate 4 supporting the semiconductor chip 1 is bonded to the semiconductor chip 1 and the glass substrate 4 is processed to reduce its thickness, thus enabling making the whole package thinner. And because the openings 12 are formed in the glass substrate 4 to expose the second wirings 3B of the semiconductor chip 1, electrical connections to an external electronic circuit can be made though the openings 12.

Figure 13:
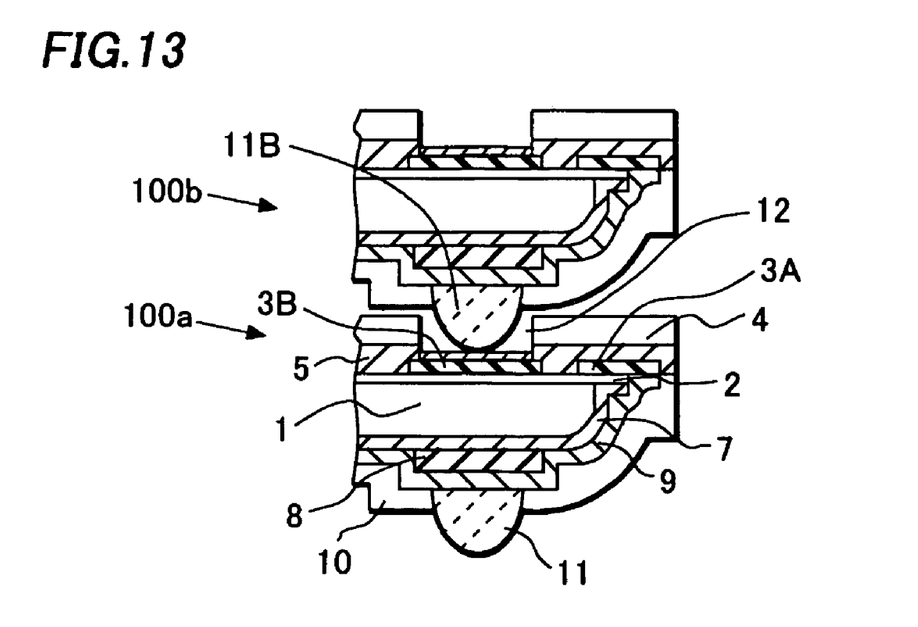
FIG. 13 is a cross-sectional view showing the manufacturing method of the semiconductor device according to the embodiment of this invention.

FIG. 13 is a cross-sectional view showing a structure of a stacked MCM as an example of such an electrically connected structure. A first semiconductor device 100a and a second semiconductor device 100b are stacked in the stacked MCM. The first semiconductor device 100a and the second semiconductor device 100b have structures similar to the semiconductor device 100 described above. A second wiring 3B of the first semiconductor device 100a is electrically and mechanically connected with a conductive terminal 11B of the second semiconductor device 100b through an opening 12. If strength of the connection is not enough, an organic adhesive, such as underfill, may be used supplementary. The number of semiconductor devices to be stacked may be chosen as required.

According to this invention, the stacked MCM can be manufactured at reduced cost without using expensive apparatus.

What is claimed is:

1. A semiconductor device comprising:
   a semiconductor chip;
   a first wiring formed on an insulation film formed on a front surface of the semiconductor chip;
   a second wiring formed on the insulation film;
   a supporting body disposed on the front surface and having an opening to expose at least part of the second wiring;
   an adhesive layer bonding the supporting body to the front surface; and
   a third wiring disposed on an additional insulation film formed on a back surface of the semiconductor chip, extending along a side surface of the semiconductor chip, and connected to the first wiring,
   wherein the supporting body does not cover any part of the back surface of the semiconductor chip.

2. The semiconductor device of claim 1, further comprising a conductive terminal disposed on the third wiring.

3. The semiconductor device of claim 2, wherein the conductive terminal comprises a projecting electrode terminal.

4. The semiconductor device of claim 3, wherein the projecting electrode terminal is a solder bump or a gold bump.

5. A semiconductor device comprising:
   a first semiconductor device comprising a first semiconductor chip, a first wiring formed on a front surface of the first semiconductor chip, a second wiring formed on the front surface, a supporting body disposed on the front surface and having an opening to expose at least part of the second wiring, an adhesive layer bonding the supporting body to the front surface, and a third wiring disposed on a back surface of the semiconductor chip, extending along a side surface of the semiconductor chip and connected to the first wiring, the supporting body not covering any part of the back surface of the semiconductor chip; and
   a second semiconductor device disposed on the first semiconductor device, the second semiconductor device comprising a second semiconductor chip and a conductive terminal that is formed on a back surface of the second semiconductor chip and is connected to the second wiring of the first semiconductor device through the opening of the supporting body.

6. The semiconductor device of claim 5, further comprising a conductive terminal disposed on the third wiring.

7. The semiconductor device of claim 6, wherein the conductive terminal comprises a projecting electrode terminal.

8. The semiconductor device of claim 7, wherein the projecting electrode terminal is a solder bump or a gold bump.

9. A semiconductor device comprising:
   a semiconductor chip;
   a first wiring formed on an insulation film formed on a front surface of the semiconductor chip;
   a second wiring formed on the insulation film;
   a flat plate disposed on the front surface and having an opening to expose at least part of the second wiring;
   an adhesive layer bonding the flat plate to the front surface; and
   a third wiring disposed on an additional insulation film formed on a back surface of the semiconductor chip, extending along a side surface of the semiconductor chip, and connected to the first wiring.

* * * * *